(12) United States Patent
Dean et al.

(10) Patent No.: US 7,390,978 B2
(45) Date of Patent: Jun. 24, 2008

(54) OVERMOLDED ELECTRONIC ASSEMBLY AND OVERMOLDABLE INTERFACE COMPONENT

(75) Inventors: Timothy B. Dean, Elk Grove Village, IL (US); Daniel T. Rooney, Schaumburg, IL (US); Jeffrey M. Petsinger, Wayne, IL (US)

(73) Assignee: Motorola, Inc., Schaumburg, IL (US)

( * ) Notice: Subject to any disclaimer, the term of this patent is extended or adjusted under 35 U.S.C. 154(b) by 125 days.

(21) Appl. No.: 11/021,429

(22) Filed: Dec. 23, 2004

(65) Prior Publication Data

US 2006/0141828 A1    Jun. 29, 2006

(51) Int. Cl.
*H01L 23/28* (2006.01)
(52) U.S. Cl. .......................... 174/521; 361/737
(58) Field of Classification Search ................. 174/521; 257/678, 757; 361/752, 757, 737
See application file for complete search history.

(56) References Cited

U.S. PATENT DOCUMENTS

| | | | | |
|---|---|---|---|---|
| 3,938,725 A | * | 2/1976 | Hardwick et al. | 228/155 |
| 5,448,452 A | * | 9/1995 | Kondo et al. | 361/760 |
| 5,841,639 A | * | 11/1998 | Schnoor et al. | 361/796 |
| 6,490,171 B2 | * | 12/2002 | Sievers et al. | 361/800 |
| 6,545,583 B1 | * | 4/2003 | Palmer | 336/192 |
| 6,778,401 B1 | * | 8/2004 | Yu et al. | 361/752 |
| 6,870,094 B2 | * | 3/2005 | Otaki | 174/382 |
| 6,933,437 B1 | * | 8/2005 | Chang | 174/368 |
| 7,066,660 B2 | * | 6/2006 | Ellison | 385/92 |

* cited by examiner

*Primary Examiner*—Hung V Ngo
(74) *Attorney, Agent, or Firm*—James A. Lamb; Valerie M. Davis; Anthony P. Curtis

(57) ABSTRACT

An overmolded electronic assembly (900, 1000, 1200) is fabricated from one or more overmoldable interface components (300, 400, 500, 1220, 1750) that may be electrical contacts or electronic components that have physical interfaces, such as speakers or sensors. The overmoldable interface components have a sacrificial end that is cut off from the remainder of the overmoldable interface components after being overmolded in an electronic assembly, providing a sealed cavity into the overmolded electronic assembly.

10 Claims, 6 Drawing Sheets

1100

1200

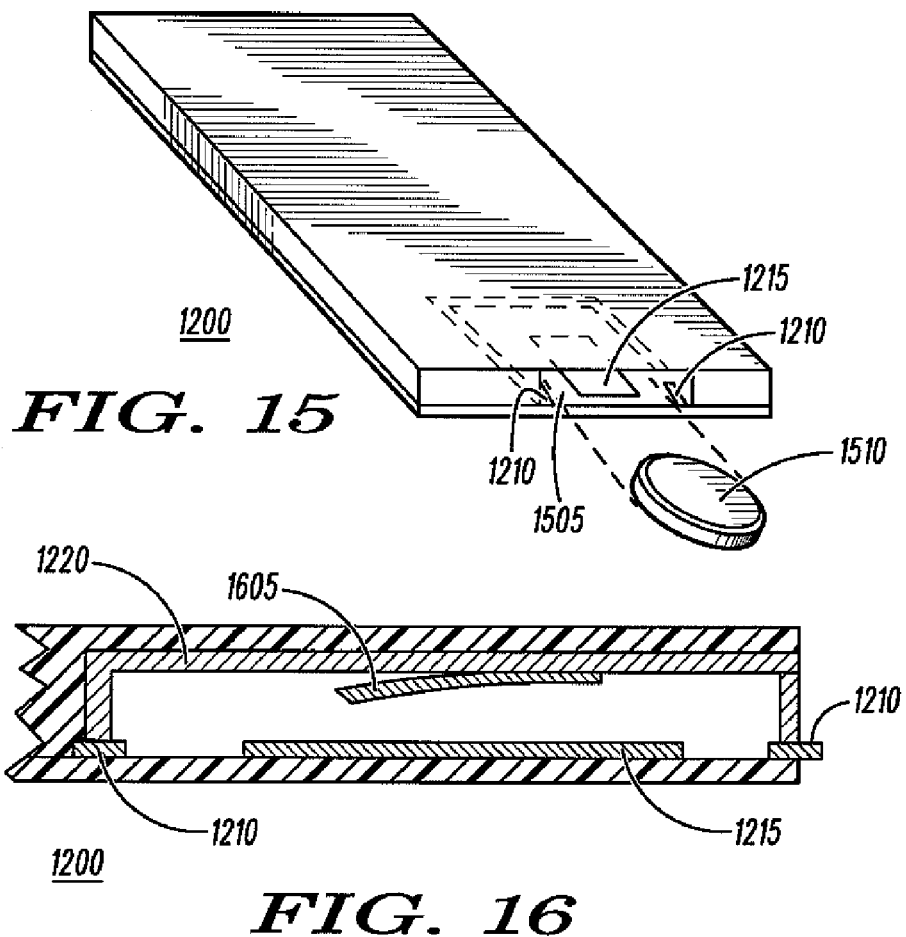
FIG. 15
FIG. 16
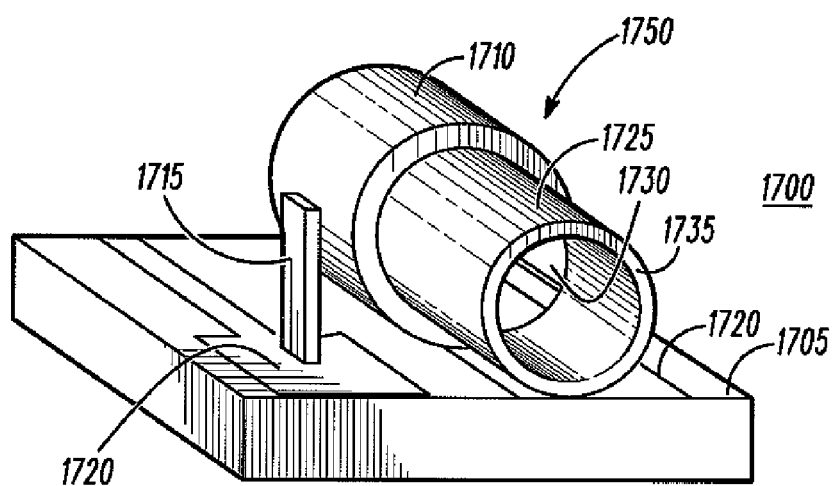
FIG. 17

OVERMOLDED ELECTRONIC ASSEMBLY AND OVERMOLDABLE INTERFACE COMPONENT

FIELD OF THE INVENTION

This invention is generally in the field of overmolded electronic assemblies, and more specifically in the techniques used to interface devices within an overmolded electronic assembly to things external to the overmolded electronic device.

BACKGROUND

Overmolded electronic assemblies have been used in conventional electronic assemblies to provide a high degree of environmental protection to electronic components that are encased within the overmolding. A typical overmolded assembly is fabricated by placing electronic parts on a printed circuit substrate of conventional material such as rigid glass epoxy, flexible polyimide, or ceramic, and soldering the parts to the substrate essentially simultaneously by a conventional process, such as wave soldering. In some techniques, the substrate has interconnection pads that extend along one or more edges away from electronic components that are affixed further from those edges, and the overmolding is applied to cover the electronic components and perhaps both sided of the substrate, but not the interconnection pads.

This technique has provided the needed environmental protection but has lead to fabrication complexities. For example, in order to removably connect the electronic assembly to other electronic devices, a connector header has been added to the interconnect pads as a secondary operation. Furthermore. non-electronic (physical) interfaces for such devices as speakers, microphones, and sensors are difficult to achieve. Accommodating a removable part, such as a battery, has also added fabrication complexity for current overmolded assemblies.

BRIEF DESCRIPTION OF THE DRAWINGS

The present invention is illustrated by way of example and not limitation in the accompanying figures, in which like references indicate similar elements, and in which:

FIGS. 13-15 are perspective drawing of an overmolded electronic assembly that includes an overmolded battery compartment portion, in accordance with some embodiments of the present invention;

FIG. 16 is an end view drawing of the overmolded electronic assembly of FIGS. 12-15, in accordance with some embodiments of the present invention;

FIG. 17 is a perspective drawing of a portion of an overmolded electronic assembly, in accordance with some embodiments of the present invention;

Figure 1:
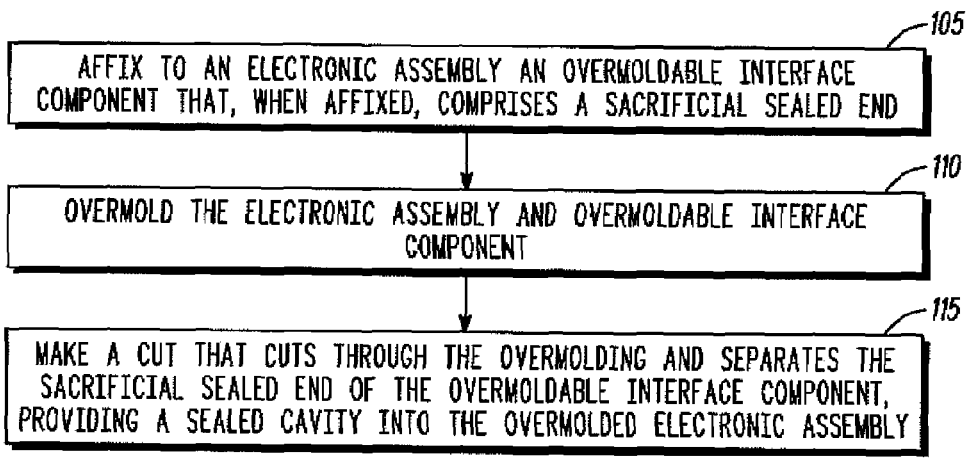
FIG. 1 is a flow chart that illustrates some steps for fabricating an overmolded assembly, in accordance with some embodiments of the present invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE DRAWINGS

Before describing in detail the particular overmolded components and assemblies in accordance with the present invention, it should be observed that the present invention resides primarily in combinations of method steps and apparatus components related to overmolded assemblies. Accordingly, the apparatus components and method steps have been represented where appropriate by conventional symbols in the drawings, showing only those specific details that are pertinent to understanding the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element that is preceded by "comprises . . . a" does not, without more constraints, preclude the existence of additional identical elements in the process, method, article, or apparatus that comprises the element. The term "another", as used herein, is defined as at least a second or more. The terms "including" and/or "having", as used herein, are defined as comprising.

Referring to FIG. 1, a flow chart 100 illustrates some steps for fabricating an overmolded assembly, in accordance with some embodiments of the present invention. At step 105, an overmoldable interface shell (OIS) is affixed to an electronic assembly. The OIS may comprise a sacrificial sealed end before it is affixed to the electronic assembly, or may comprise a shell that forms a sacrificial sealed end by the process of affixing. Thus, in both instances, the overmoldable interface shell comprises a sacrificial sealed end when affixed to the electronic assembly. The sacrificial sealed end is oriented generally away from an interior portion of the electronic assembly when the OIS has been affixed to the electronics assembly. At step 110, the electronic assembly and the OIS are overmolded with a molding material. This means that the OIS is enveloped by an overmolding material that is applied to the electronic assembly, including the sacrificial sealed end. The overmolding may be applied in a generally flowable state, or may be applied in a non-flowable state (such as a powder) that is transformed to a generally flowable state, and then is transformed to an essentially solid state, as a part of the overmolding process. The material of the overmolding may be a plastic, electrically insulating material. The overmolding material may be applied using a conventional overmolding machine, or may be applied using more labor intensive techniques. "Enveloped" does not mean that all surfaces of the OIS are necessarily in contact with the overmolding material; the overmolding material generally does not contact surfaces of the OIS that are in environmentally sealed contact with surfaces of the electronic assembly at the time of overmolding, such as those surfaces of the OIS that are in sealed contact with surfaces of the electronic assembly as a result of the operation of affixing the OIS to the electronic assembly in step 105. For example, when the OIS is a metal shell that is soldered to a printed circuit board, the OIS is affixed and environmentally sealed to the printed circuit board, so the overmolding does not cover the surface of the OIS that is environmentally sealed to the printed circuit board. The overmolding does seal all other surfaces of the electronic assembly, including electronic components mounted to the electronic assembly that need environmental protection, and may seal other parts that don't need environmental protection. Thus, for example, when there are no through holes in a printed circuit board and no parts on the "back" of the printed circuit board that need protection, the overmolding need not cover the back of the printed circuit board. Examples of this situation could be a printed circuit assembly that has through holes and integrated circuits on its backside that have been environmentally protected by a conformal coat on the back of the printed circuit board, or a ceramic substrate of an electronics assembly that has no through holes or parts on the back side. After the overmolding is essentially complete, a cut is made at step 115 that cuts through the overmolding and the OIS, separating the sacrificial sealed end of the OIS from a remainder of the OIS, thereby forming an environmentally sealed cavity that extends into the overmolding, thus maintaining the integrity of the environmental protection provided by the overmolding. The integrity is maintained by the OIS, which, when affixed to the electronic assembly, is environmentally sealed from the interior of the electronic assembly.

As will be described in more detail below, the OIS may be metal or non-metal. When the OIS is metal, the OIS may be soldered to a substrate or other part of the electronic assembly. Alternatively, it may be affixed (whether metal or non-metal) to a component of the electronic assembly, either by a tight fit alone or by a combination of a clearance fix and a sealant/attachment material. The OIS may form interfaces for the electronic assembly such as an electronic connector; an environmental port such as a speaker port, a microphone port, or a sensor port; or a battery housing. In some embodiments, the OIS itself is an entirely closed component until the sacrificial sealed end is cut off to form the environmentally sealed cavity into the overmolded electronic assembly. In other embodiments, the OIS is open on an interior end that is affixed and sealed to an electronic component in the electronic assembly. When the sealed end is cut off, a sealed cavity into the overmolded electronic assembly is formed that includes a surface of the electronic component, such as a sensor vent. The electronic component itself is environmentally sealed from the interior of the electronic assembly. Thus, the present invention encompasses overmoldable interface components that may include electrical contacts or electronic components that have physical interfaces, such as speakers or sensors.

Figure 2:
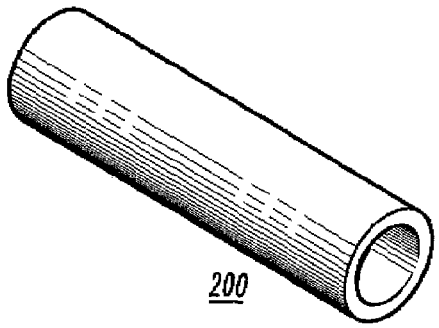
FIG. 2 is a perspective mechanical drawing that shows a tube that is a precursor to an overmoldable interface shell (OIS), in accordance with some embodiments of the present invention.

Referring to FIG. 2, a perspective mechanical drawing shows a tube 200 that is a precursor to an overmoldable interface shell (OIS), in accordance with some embodiments of the present invention. The tube of this example is a right circular cylinder that is made of a conductive metal, which may have a diameter of approximately 0.5 to 3.0 mm, and may be approximately 5 mm long. Tubes having other cylindrical cross sections may be used, such as tubes with rectangular, oval, or flattened circular cross sections.

Figure 3:
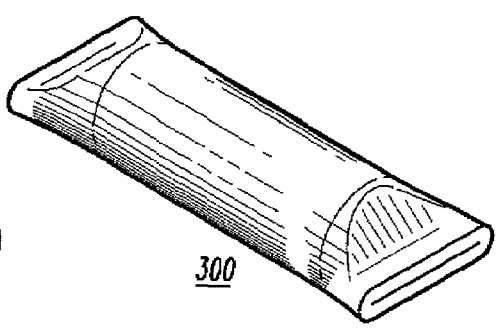
FIG. 3 is a perspective mechanical drawing that shows an overmoldable interface shell (OIS) 300, in accordance with some embodiments of the present invention.

Referring to FIG. 3, a perspective mechanical drawing shows an overmoldable interface shell (OIS) 300, in accordance with some embodiments of the present invention. The OIS 300 has been fabricated by pinching each end of the tube 200 sufficiently to achieve an environmental seal at each end.

Figure 4:
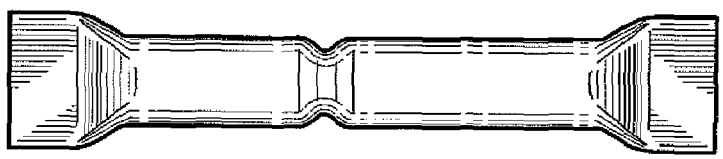
FIG. 4 is a perspective mechanical drawing that shows an overmoldable interface shell (OIS), in accordance with some embodiments of the present invention.

Referring to FIG. 4, a perspective mechanical drawing shows an overmoldable interface shell (OIS) 460, in accordance with some embodiments of the present invention. The OIS 400 is similar to the OIS 300 in that the ends have been pinched to achieve environmental seals, but differs by having a corset 405 as well. The corset 405 is shown as being symmetrical around the circumference of the OIS 400*l*, but a corset 405 of an OIS may be in other forms, such as having opposing depressions along two sides of an OIS having an oval cross section. The corset 405 may serve to temporarily retain a wire until it is soldered in place, or in some instances provide electrical connection and long term retention of the wire. Long term retention using only the corset 405 may be assured by soldering the wire in place, or may be assured by being used in conjunction with many other OIS's, such as for connecting to a ribbon cable, or, for example, by external wire retention clamps.

In addition to achieving the sealing of the ends of an OIS by pinching them, the ends may be sealed by other techniques, such as placing a cap over each end or placing a plug into each end, or any combination of pinching, plugging, or capping. The plugs or caps may achieve a seal with a cylindrical OIS by having an interference fit, or by having a slip fit and using a sealant. Malleable or liquid sealants alone may be used. In the case of certain metallic OIS's the sealant may be solder. The ends may alternatively be fabricated as a portion of an OIS. For example, when the OIS is made of plastic (of which examples are described below), at least one sealed end may be molded in the process of fabricating the part. A sealed end could be achieved in a metallic OSI by machining or sheet forming, but this may be less economically attractive than pinching.

Figure 5:
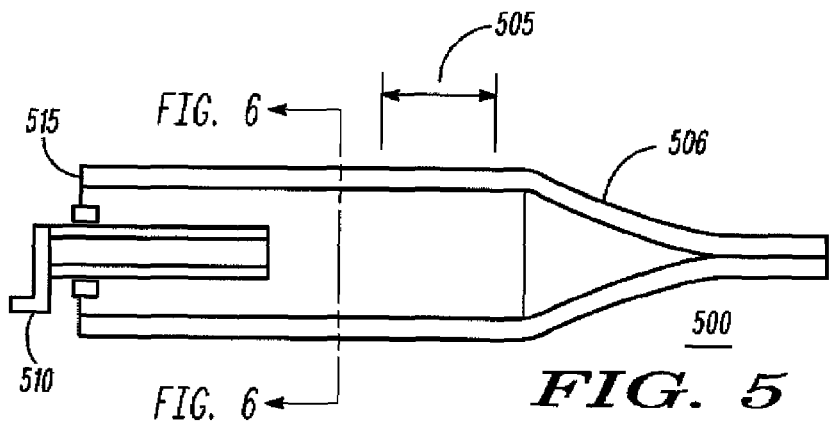
FIGS. 5 and 6 are cross sectional mechanical drawings that show an overmoldable interface shell (OIS) 500, in accordance with some embodiments of the present invention.
Figure 6:
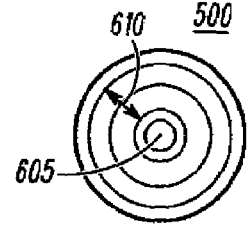

Referring to FIGS. 5 and 6, cross sectional mechanical drawings show an overmoldable interface shell (OIS) 500, in accordance with some embodiments of the present invention. The OIS 500 is a made primarily of conductive metal and is designed to accept a small coaxial cable. Cylindrical region 605 can accept a center conductor of the small coaxial cable, and region 610 can accept a ground conductor of the coaxial cable. The OIS 500 is soldered to a circuit substrate using a tab 510 connected to the center conductor acceptor, and using a bottom portion 515 of the OIS. An insulator insulates the center conductor acceptor from the body of the OIS. A region 505 is provided for the saw kerf that separates the sacrificial sealed end 506 of the OIS 500 from the remainder of the OIS 500.

Figure 7:
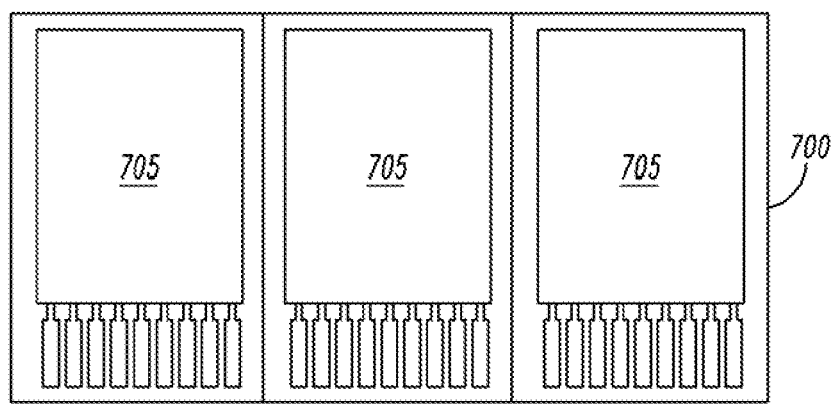
FIG. 7 is a plan view of a printed circuit substrate, in accordance with some embodiments of the present invention.

Referring to FIG. 7, a plan view of a printed circuit substrate 700 is shown, in accordance with some embodiments of the present invention. The printed circuit substrate 700 comprises three electronic assembly layouts, each having a circuit layout region 705 and an interconnection region 710. Each interconnection region 710 comprises a plurality of circuit pads.

Figure 8:
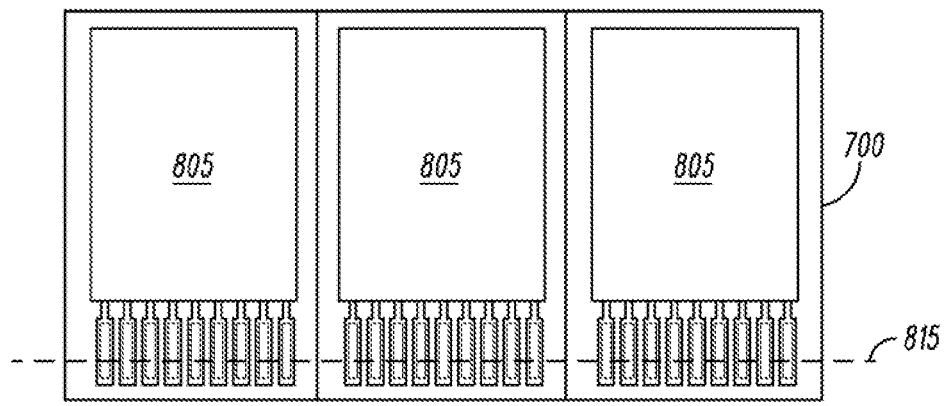
FIG. 8 is a plan view of the printed circuit substrate of FIG. 7 after electronic parts have been wave soldered in place, in accordance with some embodiments of the present invention.

Referring to FIG. 8, a plan view of the printed circuit substrate 700 is shown after electronic parts have been wave soldered in place, in accordance with some embodiments of the present invention. The circuit layout regions have become regions of interconnected electronic parts 805, and OIS's 810 have been wave soldered to the circuit pads. The OIS's may be of the type described with reference to FIGS. 1-6. Each of the OIS's has a saw kerf region that is substantially aligned with saw kerf regions of others of the plurality of OIS's, in this example along line 815. The respective alignment of the saw kerf regions is such that a cut along the line 815 will remove the sacrificial end of each of the OIS's, leaving a cavity that is useful for an intended purpose, such as electrically conductive interfacing. Not all OIS's need be identical, and as further described below, some of them may be non-metallic. Each OIS a sacrificial sealed end and may have an internal sealed end. In some instances, the ends may be indistinguishable before the OIS's are attached to the printed circuit substrate (or to an electronic part, as described below).

Figure 9:
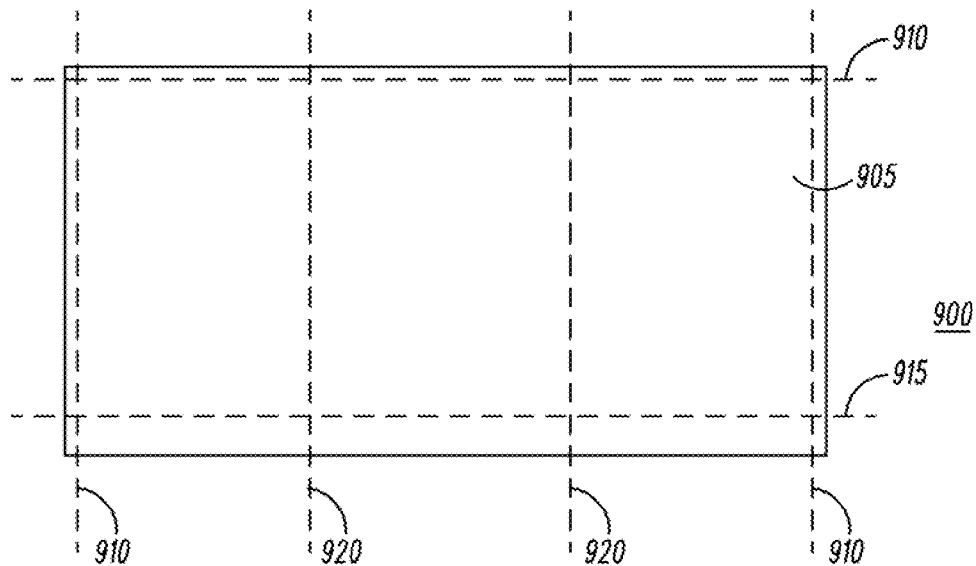
FIG. 9 is a plan view of an overmolded electronic assembly, in accordance with some embodiments of the present invention.

Referring to FIG. 9, a plan view of an overmolded electronic assembly 900 is shown, in accordance with some embodiments of the present invention. The overmolded electronic assembly 900 may be formed by adding, using any compatible present or future technique, an overmolding material to an assembly of electronic parts on a printed circuit substrate such as that described above with reference to FIG. 8, or any other one that has had electronic parts interconnected and that includes at least one OIS. The overmolding material is typically a plastic material, and in some embodiments is chosen so that soldering can be performed to OIS parts after the overmolding is completed, without ruining the environmental protection of the overmolded electronic parts and interconnections provided by the overmolding material. The overmolding material generally extends proximate to the edges of the printed circuit substrate, but may be irregular along those edges, depending on the technique and material used. When the edges of the overmolding are expected to be irregular, they may be cut as shown by cut lines 910 in the example of FIG. 9, which are a small distance within the edges. A cut is also made along cut line 915 that matches the saw kerf line 815, causing a separation of the OIS sacrificial sealed ends from the remainders of the OIS's, exposing their sealed cavities. Cuts made along cut lines 920 separate the three overmolded electronic assemblies. The cuts made be made in any order, but making the separation cuts 920 after the others may be the most economical order. Although the term "saw kerf" has been used above to describe the region of the OIS's that has been designed to be cut to remove the sacrificial sealed end of the OIS's, the cuts along lines 910, 915, 920 may be by any technique that is compatible with the materials involved. Examples of such techniques are blade cutting (circular or band saw), water (or other fluid) jet cutting, laser cutting, routing, and grinding. (In the case of grinding, the saw kerf region would extend to the external end of the OIS, since it would be ground down from that end). The saw kerf need not be perpendicular to the printed circuit substrate; there may be valid reasons to have an angular cut, but it will be appreciated that the process of cutting leaves an opening of the OIS that is flush with a face of the electronic assembly.

Figure 10:
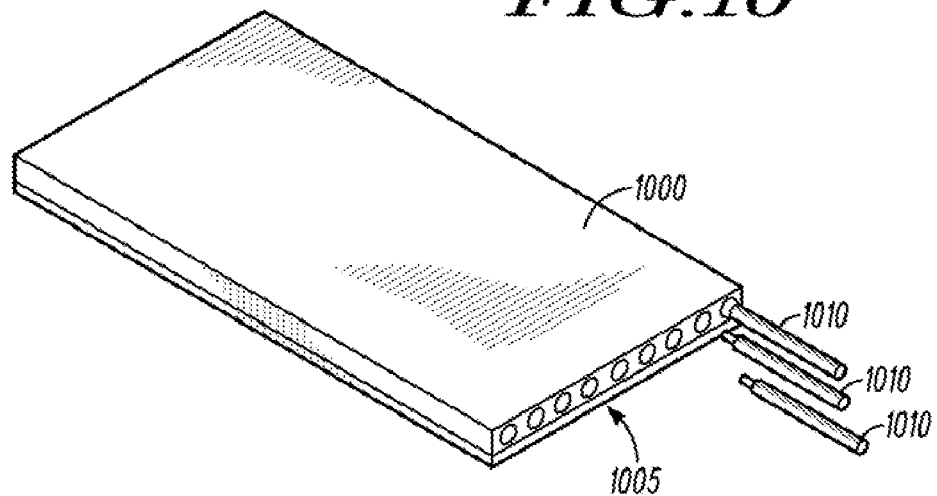
FIG. 10 is a perspective drawing of an overmolded electronic assembly is shown, in accordance with some embodiments of the present invention.

Referring to FIG. 10, a perspective drawing of an overmolded electronic assembly 1000 is shown, in accordance with some embodiments of the present invention. The overmolded electronic assembly 1000 is representative of one having a plurality of OIS's 1005 into which wires 1010 are inserted and soldered in order to complete an interface with electronics external to the overmolded electronic assembly 1000 (only the ends of three wires of a plurality of such wires are shown in FIG. 10). The OIS's may be, for example, of the type described with reference to FIGS. 1-6.

Figure 11:
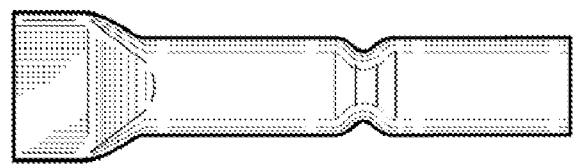
FIG. 11 is a plan view drawing of an overmoldable interface shell, in accordance with some embodiments of the present invention.

Referring to FIG. 11, a plan view drawing of an overmoldable interface shell 1100 is shown, in accordance with some embodiments of the present invention. This plan view shows what the appearance of the OIS 400 (FIG. 4) is after it has been overmolded, cut and removed from the overmolding and printed circuit substrate.

Figure 12:
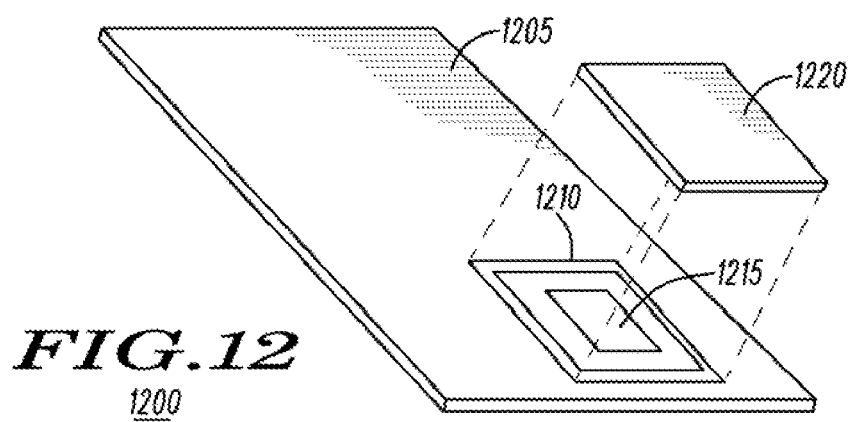
FIG. 12 is a perspective assembly drawing of an overmolded electronic assembly that includes an overmolded battery compartment portion, in accordance with some embodiments of the present invention.

Referring to FIG. 12, a perspective assembly drawing of an overmolded electronic assembly 1200 that includes an overmolded battery compartment portion is shown, in accordance with some embodiments of the present invention. A printed circuit substrate 1205 includes, in addition to layout patterns for other electronic parts (not shown in FIG. 12), a battery layout pattern comprising a shell pattern 1210 and a battery contact pattern 1215. A battery compartment OIS 1220 is shown above the printed circuit substrate 1205. The battery compartment OIS 1220 is, in this example, basically a five-sided electrically conductive sheet metal part with interior aspects described below. The shell pattern 1210 is designed to be soldered to the four bottom edges of the five sided electrically conductive sheet metal part of the battery compartment OIS 1220, forming a GIS having a sacrificial end when soldered.

Figure 13:
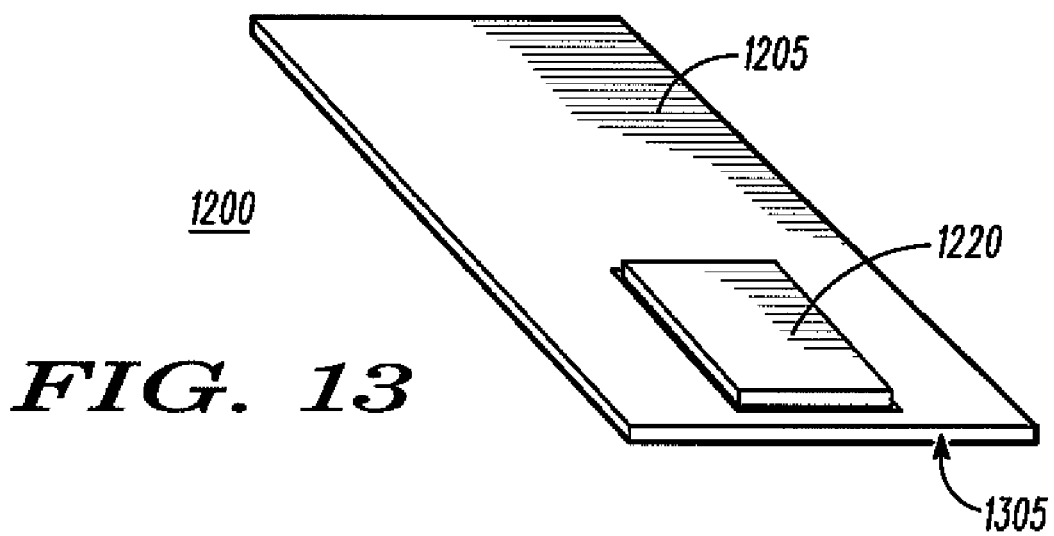

Referring to FIG. 13, a perspective drawing of the overmolded electronic assembly 1200 is shown, in accordance with some embodiments of the present invention. This shows the battery compartment OIS 1220 after it has been soldered to the printed circuit substrate 1205, which then has a sacrificial sealed end 1305.

Figure 14:
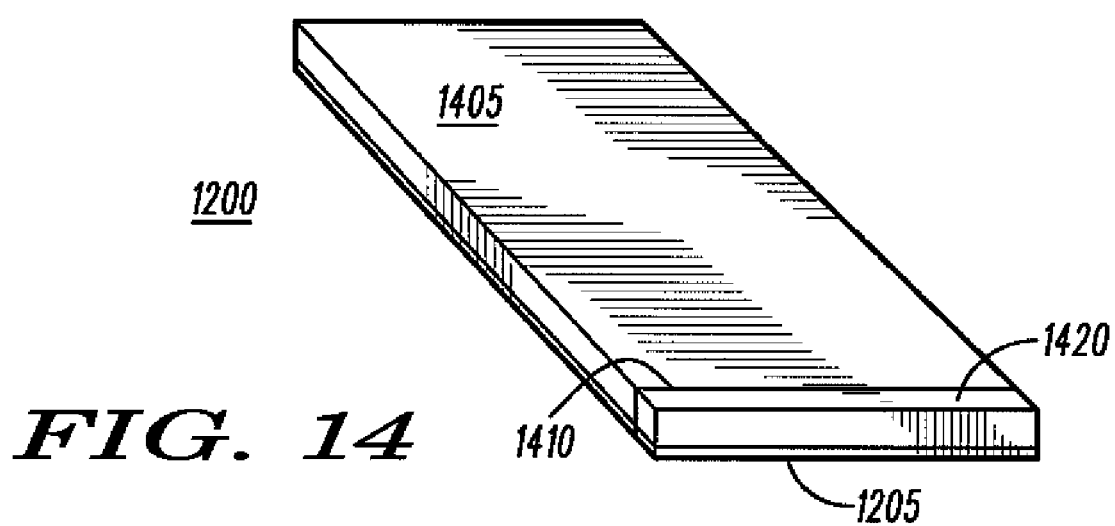

Referring to FIG. 14, a perspective drawing of the overmolded electronic assembly 1200 is shown, in accordance with some embodiments of the present invention. The overmolded electronic assembly 1200 comprises the printed circuit substrate 1205, with the electronics parts soldered to it, including the battery compartment OIS 1220, after the overmolded electronic assembly 1200 has been overmolded with overmolding 1405. The view in FIG. 14 is the same view as in FIG. 13, and a cut line 1410 is shown in FIG. 14 that will cut through the battery compartment OIS 1220 to remove a sacrificial sealed end 1420 of the battery compartment OIS 1220/printed circuit substrate combination.

Referring to FIG. 15, a perspective drawing of the overmolded electronic assembly 1200 is shown, in accordance with some embodiments of the present invention. This shows the overmolded electronic assembly 1200 after the saw cut has been made along the cut line 1410 (FIG. 14), removing the sacrificial sealed end of the five sided battery compartment OIS 1220. A sealed cavity 1505 is left into which a "button cell" battery 1510 may be inserted.

Referring to FIG. 16, an end view drawing of the overmolded electronic assembly 1200 is shown, in accordance with some embodiments of the present invention. In addition to items already identified above, a battery spring 1605 is shown. The battery spring 1605 is preferably a conductive spring material, such as stainless steel, that is affixed to the battery compartment OIS 1220, such as by a spot weld. (For compatibility, the battery compartment OIS 1220 may also be made of stainless steel.) Thus a sealed battery compartment has been provided in an overmolded electronic assembly in a highly cost effective manner.

Referring to FIG. 17, a perspective drawing of a portion of an overmolded electronic assembly 1700 is shown, in accordance with some embodiments of the present invention. For purposes of this description, the overmolded electronic assembly 1700 is shown after fabrication has been completed, but with the overmolding material removed. The portion of the overmolded electronic assembly 1700 comprises a portion of a printed circuit substrate 1705, a miniature potentiometer 1710, and a cylindrical OIS 1725. The miniature potentiometer 1710 has two electronic terminations 1715, of which only one is visible in FIG. 17, and an adjustment screw 1730. The electronic terminations 1715 are soldered to solder pads 1720 of the overmolded electronic assembly. The adjustment screw rotates within a circular cylindrical sleeve portion of the miniature potentiometer 1710 that is not visible in FIG. 17. The cylindrical OIS 1725 is a right circular cylinder shaped piece that fits over the sleeve portion, and is sealed to the miniature potentiometer 1710. The sealing may be accomplished by a tight or interference fit of the OIS 1725 and a face of the sleeve, or may be accomplished by a slip fit of the OIS 1725 and the face of the sleeve that is sealed by an adhesive or other sealant material. It will be appreciated that the cylindrical OIS 1725 need not be electrically conductive, although it may be. The cylindrical OIS 1725 may be made of a plastic, ceramic, or any other material that is compatible with the conditions imposed during the application and cutting of the overmolding. The cylindrical OIS 1725 in conjunction with the miniature potentiometer 1710 provides a sealed cavity that allows convenient access to the adjustment screw 1730 of the miniature potentiometer 1710 that is very cost effective to produce. The cylindrical OIS 1725 has been cut so that the face 1735 of the cut cylindrical OIS 1725 and an edge of the printed circuit substrate 1740 are flush with the overmolding material (which is not shown. The cylindrical OIS 1725 together with the miniature potentiometer 1710 constitute an overmoldable interface component 1750 when they have been mated (at which time the cylindrical OIS 1725 comprises a sacrificial sealed end that is not shown in FIG. 17).

The OIS's 300, 400, 500, 1220 are, in essence, classifiable as both overmoldable interface shells and overmoldable interface components.

It will be further appreciated that a cylindrical OIS may be used for a variety of other electronic parts that have a sealed portion that are designed to interface to the environment outside of an overmolded electronic assembly. Just a few examples are a speaker, a microphone, an optical lens for optical input or output, and a humidity sensor. Although the example in this drawing has a physical interface to the external environment that is a circular cylinder, it will be appreciated that the interface could be in the form of other cylinders (e.g., oval, rectangular), and could alternatively be of more complicated nature, requiring an OIS that may have a cylindrical portion to provide a channel to the environment that is external to the overmolded electronic assembly, and may also have another portion, such as a flat face that is perpendicular to the cylindrical portion. The channel to the environment itself need not be cylindrical in form. For some applications, a complex part (molded or otherwise formed) may serve as an OIS. The OIS, though, includes a sacrificial sealed end that is cut off to expose a sealed cavity in a wall of the overmolded electronic assembly formed at least in part by the remainder of the OIS. It will be appreciated that an overmoldable interface component comprising a physical interface portion (such as an adjustment screw, or speaker transducer, microphone transducer, sensor orifice, or optical lens), an electrical portion (such as resistance of a potentiometer or output electrical signal (analog or digital) of a sensor, or electrical input signal of an optical source), and an overmoldable interface shell that is sealed around the physical interface portion of the electronic component comprises a sacrificial sealed end and a saw kerf region between the physical interface portion and the opposing seal end, and could be fabricated or acquired as a single component and installed into an electronic assembly that is to be overmolded. In such an instance, the overmoldable shell may be an integral part of a body of the electronic component, particularly when the body is made up of molded pieces.

Figure 18:
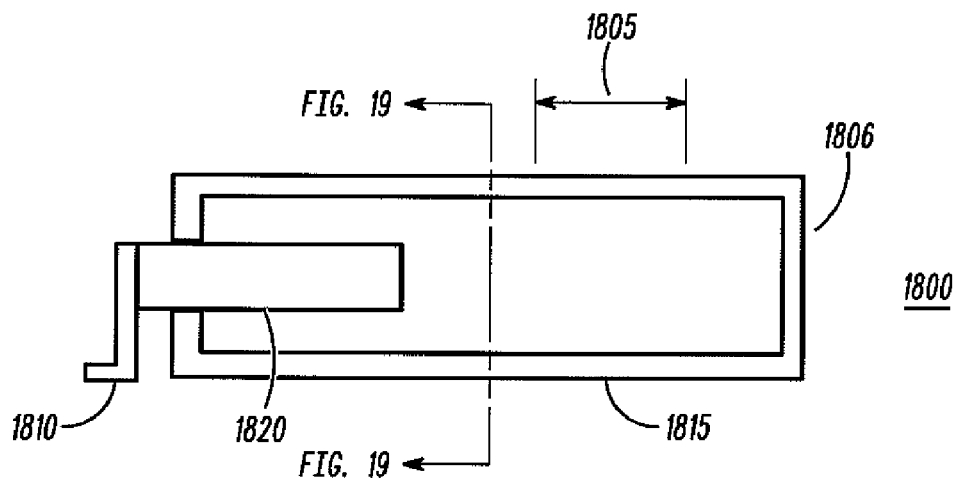
FIGS. 18 and 19, are two simplified cross sectional views of an overmoldable electronic component, in accordance with some embodiments of the present invention.
Figure 19:
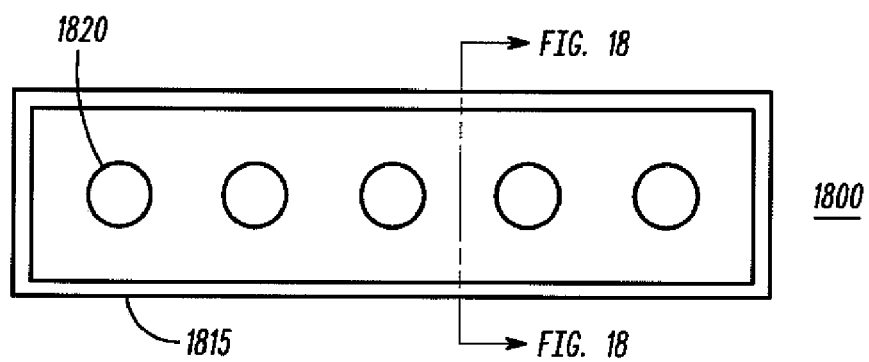

Referring to FIGS. 18 and 19, two simplified cross sectional views of an overmoldable electronic component 1800 are shown, in accordance with some embodiments of the present invention. The overmoldable electronic component 1800 is a multi-contact connector having five contact pins 1820 that are molded into a plastic shell 1815. Each of the contact pins 1820 has a solder tab portion 1810. The overmoldable electronic component 1800 is attached to an electronics assembly (not shown in FIGS. 18 and 19) at least by the solder tabs 1810 being soldered to a printed circuit substrate of the electronics assembly. The plastic shell 1815 has a sacrificial end 1806 and a saw kerf region 1805 that allows the sacrificial end 1805 to be cut off after the overmolding is completed, without damaging the remaining portion, It will be appreciated that the shell could alternatively be made of electrically conductive metal, but that isolating material would have to be included to surround the contact pins 1820. In either case, the overmoldable electronic component 1800 provides an internal metal contact that is electrically isolated from a cavity wall of the plastic shell 1815 of the overmoldable electronic component 1800 and wherein the internal metal contact electrically connected to the overmolded electronics assembly, by the solder tab 1810 in the example shown.

Figure 20:
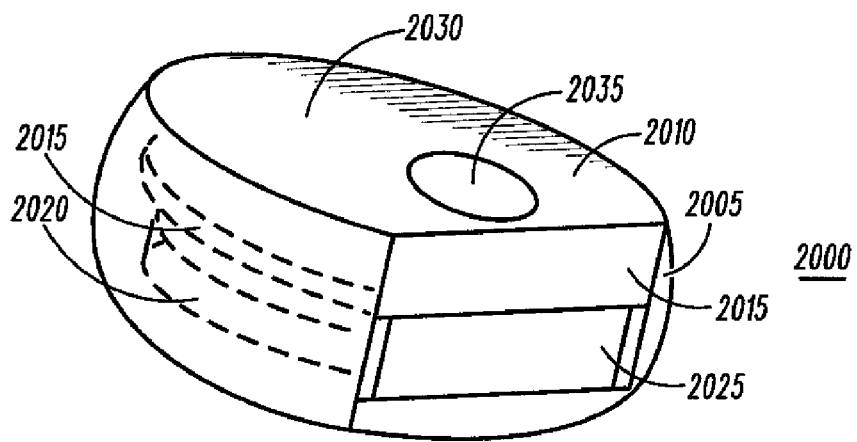
FIG. 20 is a perspective view of an overmolded electronic assembly, in accordance with some embodiments of the present invention.

Referring to FIG. 20, a perspective view of an overmolded electronic assembly 2000 is shown, in accordance with some embodiments of the present invention. The electronics assembly 2000 is a hearing aid module that comprises a glass epoxy printed circuit board 2015 that has active electronic components one a first side and a battery compartment on a second side. During fabrication of the electronics assembly 2000, overmolding was applied to all parts of the electronic assembly 2000, then two cuts were made that created surfaces 2005 and 2010. The overmolding process may be one of dipping the electronics assembly into a liquid overmolding material, or another method. The cut that created surface 2010 was made through saw kerf regions of two overmoldable electronic components, a speaker and a volume adjustment potentiometer, removing sacrificial portions of the two overmoldable electronic components, and leaving a first sealed cavity 2030 that includes an adjustment screw of the potentiometer and a second sealed cavity 2035 that leads to an orifice of a sealed speaker transducer The cut that created surface 2005 was made through saw kerf regions of an overmoldable battery compartment box, removing a sacrificial portion of the box, and leaving a third sealed cavity that is shown covered by a battery door 2025 in FIG. 20. Thus it will be appreciated that a cut to fabricate the present invention does not need to be perpendicular to a printed circuit substrate of the overmolded electronic assembly, and that the overmolding material may envelope both sides of a printed circuit substrate. Furthermore, there may be a plurality of printed circuit substrates in an overmolded electronic assembly of the present invention.

The overmolded electronic assembly according to the present invention can be used in a wide variety of electronic equipment, including consumer products ranging from portable music players to automobiles, military products such as communication radios and communication control systems, and commercial equipment ranging from extremely complicated computers to robots to simple pieces of test equipment, just to name some types and classes of electronic equipment.

In the foregoing specification, the invention and its benefits and advantages have been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims.

What is claimed is:

1. An overmolded electronic assembly, comprising:
   an electronic assembly that comprises:
      a plurality of electronic components, and
      one or more overmoldable interface components that are each sealed at an internal end; and
   an overmolding that envelops the plurality of electronic components of the electronic assembly, wherein each of the one or more overmoldable interface components provides a sealed cavity in the overmolding and has an opening that is flush with a flat surface of the overmolding.

2. The overmolded electronic assembly according to claim 1, wherein the opening of each overmoldable interface component has been cut flush with the flat surface of the overmolding.

3. The overmolded electronic assembly according to claim 1, wherein each overmoldable interface component is a cylindrical metal shell that is soldered to a solder pad of a circuit substrate of the electronic assembly.

4. The overmolded electronic assembly according to claim 3, wherein the internal end of the cylindrical metal shell is one of a pinch sealed, a plug sealed, and a cap sealed end.

5. The overmolded electronic assembly according to claim 1, wherein at least one of the one or more overmoldable interface components comprises a five sided box.

6. The overmolded electronic assembly according to claim 5, wherein the five sided box comprises a four sided metal box soldered to a printed circuit substrate.

7. The overmolded electronic assembly according to claim 1, wherein at least one of the one or more overmoldable interface components comprises an internal metal contact that is electrically isolated from a cavity wall of the overmoldable interface component and wherein the internal metal contact is electrically connected to a substrate of the overmolded electronics assembly.

8. The overmolded electronic assembly according to claim 1, wherein at least one of the one or more overmoldable interface components further comprises an internal cylindrical end that encloses and is sealed to a cylindrical portion of at least one of the electronic components.

9. The overmolded electronic assembly according to claim 1, wherein at least one of the electronic components is disposed within the sealed cavity of at least one of the one or more overmoldable interface components such that the at least one of the electronic components is exposed at the flat surface of the overmolding.

10. The overmolded electronic assembly according to claim 1, wherein the electronic components are disposed within the sealed cavity of at least one of the one or more overmoldable interface components such that the electronic components are exposed at the flat surface of the overmolding.

* * * * *